US010852622B2

(12) United States Patent
Qureshi

(10) Patent No.: US 10,852,622 B2
(45) Date of Patent: *Dec. 1, 2020

(54) SIGNAL WAVE GENERATOR APPARATUS WITH POLARIZATION CONTROL

(71) Applicant: KING FAHD UNIVERSITY OF PETROLEUM AND MINERALS, Dhahran (SA)

(72) Inventor: Khurram Karim Qureshi, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 16/132,083

(22) Filed: Sep. 14, 2018

(65) Prior Publication Data

US 2019/0011804 A1  Jan. 10, 2019

Related U.S. Application Data

(63) Continuation of application No. 15/255,781, filed on Sep. 2, 2016, now Pat. No. 10,114,270.

(51) Int. Cl.
*G02F 3/00* (2006.01)
*G02F 1/095* (2006.01)
(Continued)

(52) U.S. Cl.
CPC .............. *G02F 3/00* (2013.01); *G02F 1/0955* (2013.01); *H01S 5/0608* (2013.01); *H01S 5/005* (2013.01);
(Continued)

(58) Field of Classification Search
CPC ........ G02F 3/00; G02F 1/0955; H01S 5/0608; H01S 5/4006; H01S 5/12; H01S 5/005; H01S 5/0078
(Continued)

(56) References Cited

U.S. PATENT DOCUMENTS

2004/0184491 A1  9/2004  Wai
2007/0189703 A1  8/2007  Covey
(Continued)

FOREIGN PATENT DOCUMENTS

KR       2013094408 A    8/2013

OTHER PUBLICATIONS

H.Zhao, et al., "Wavelength bistability based on optical injection in a novel tunable dual mode laser" http://www.osapublishing.org/oe/fulltext.cfm?uri=oe-24-4-3817&id=336291, 2016, pp. 1-15.
(Continued)

*Primary Examiner* — Jade R Chwasz
(74) *Attorney, Agent, or Firm* — Oblon, McClelland, Maier & Neustadt, L.L.P.

(57) ABSTRACT

An optical logic device includes a distributed feedback laser configured to generate a first signal corresponding to distributed feedback laser output signal, the first signal being at a first wavelength. The device further includes a bandpass filter having a center frequency corresponding to the first wavelength. Additionally, the device can include an optical circulator having a first port coupled to a logic device input signal, a second port coupled to the first signal, and a third port coupled to the bandpass filter, wherein when the logic device input signal has a power above a predetermined threshold and there is a wavelength difference between the first wavelength and an input wavelength of the logic device input signal, a suppression of the first signal occurs.

7 Claims, 15 Drawing Sheets

(51) Int. Cl.
  *H01S 5/06* (2006.01)
  *H01S 5/00* (2006.01)
  *H01S 5/12* (2006.01)
  *H01S 5/40* (2006.01)

(52) U.S. Cl.
  CPC .............. *H01S 5/0078* (2013.01); *H01S 5/12* (2013.01); *H01S 5/4006* (2013.01)

(58) Field of Classification Search
  USPC ........................................................ 359/108
  See application file for complete search history.

(56) References Cited

U.S. PATENT DOCUMENTS

2008/0247018 A1  10/2008  Bogoni
2010/0046950 A1  2/2010   Cao

OTHER PUBLICATIONS

A.Hurtado, et al., "Boolean logic device done with DFB laser diode", http://oa.upm.es/29001/1/Boolean_logic.pdf,2004, pp. 58-65.

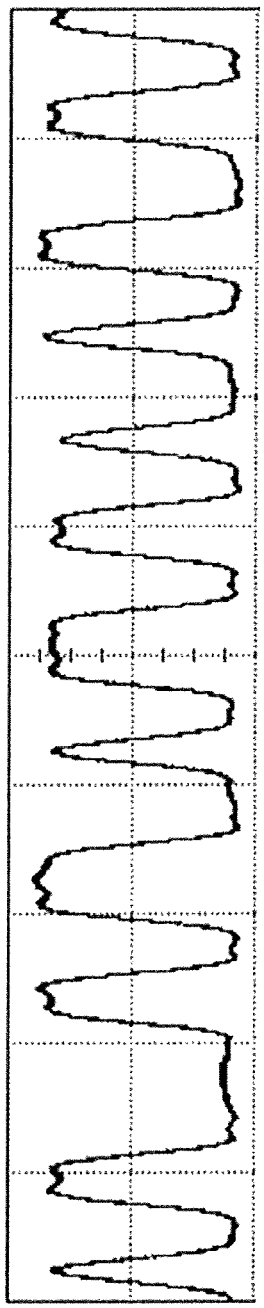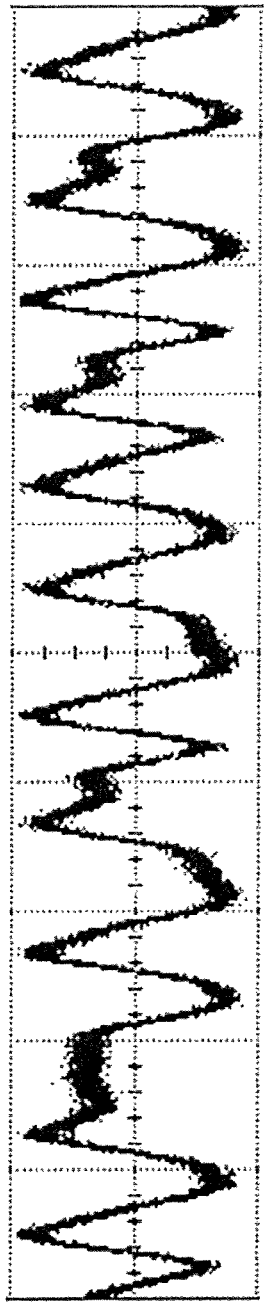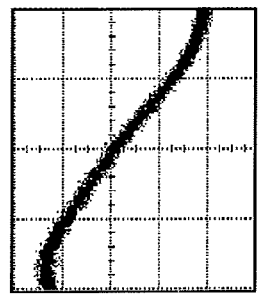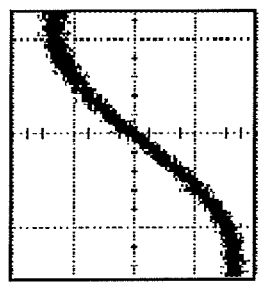

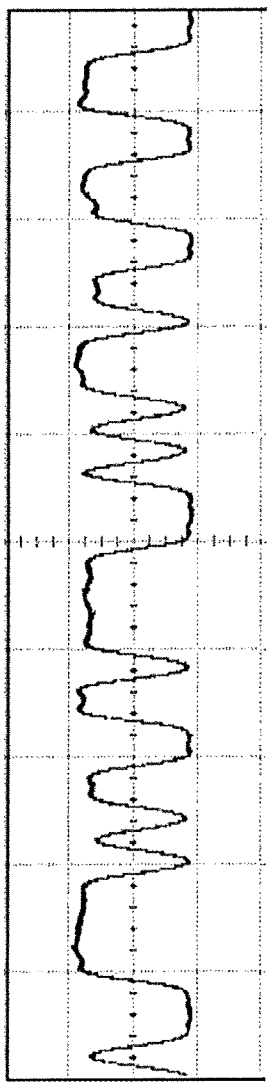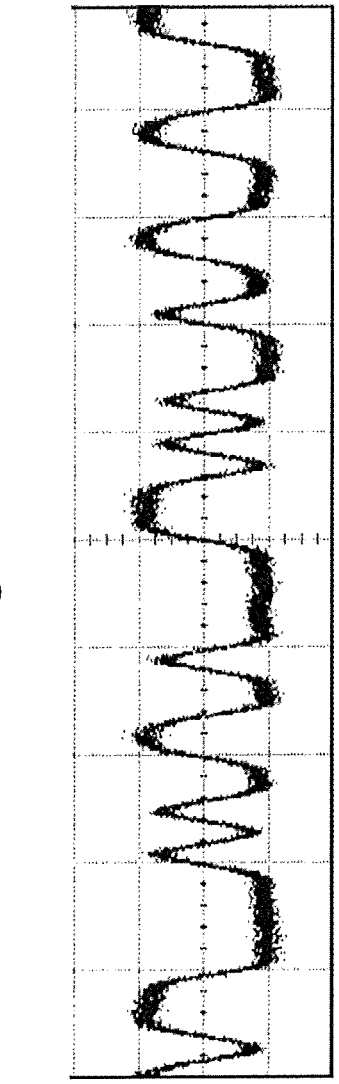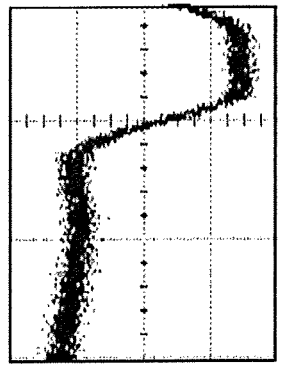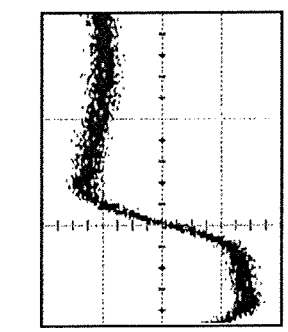

1400

1405

1410

SIGNAL WAVE GENERATOR APPARATUS WITH POLARIZATION CONTROL

CROSS-REFERENCE TO RELATED APPLICATIONS

The present application is a Continuation of Ser. No. 15/255,781, now allowed, having a filing date of Sep. 2, 2016.

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

All-optical digital information processing can be based on all-optical logic to be used for all-optical computing, for example. Optical computing can use photons procduced by lasers for computation.

Stubkjaer and Berrettini et al. reoprt using corss-phase modulation or cross grain modulation in Semiconductor Optical Amplifiers [R. E. Stubkjaer," Semiconductor optical amplifier-based all-optica logic gates for high-speed optical processing," IEEE J. Sec. Top. Quantum Electron, vol. 6, 1428-1435, 2000] [S. G. Berrettini, A. Simi, A. Malacarne, A. Bogoni, and L. Poti, "Ultrafast integrable and reconfigurable XNOR, NOR and NOT photonic logic gate," IEEE Photo. Technol. Lett., vol.18, pp. 917-919, 2006].

Xu et al. and Ibrahim et al. report all-optical gates utilizing silicon micro-ring resonators [Q. Xu and M. Lipson, "All-optical logic based on silicon microring resonators," Opt. Express, vol 15, pp. 924-929, 2007] [T. A. Ibrahim, K. Amamath, L. C. Kuo, R. Grover, V. Van, and P. T. Ho, "Photonic logic NOR gate based on two symmetric microring resonators," Opt. Lett, vol 29, 2779-2781, 2004].

Wang et al. and Lee et al. report logic gates based on the sum and difference frequency generation in periodically poled lithium niobate waveguides [J. Wang, J. Sun, Q. Sun, D. Wang, X. Zhang, D. Huang, and M. M. Fejer, "PPLN based flexible optical logic AND gate," IEEE Photo. Technol. Lett., vol.20, pp. 211-213, 2008] [Y. L. Lee, B. A. Yu, T. J. Eom, W. Shin, C. Jung, Y. C. Noh, J. Lee, D. K. Ko, and K. Oh, "All-optical AND and NAND gates based on cascaded second-order nonlinear processes in a Ti-diffused periodically poled $LiNbO_3$ waveguide," Opt. Express, vol 14, pp. 2776-2782, 2006]

Chan et al., Nikarmi et al., Hui et al., Hosiny et al., Tsang et al., and Lin et al. report opitcal injection locking in semiconductor lasers such as Fabry Perot laser diodes [L. Y. Chan, K. K. Qureshi, P. K. A. Wai, B. Moses, L. F. K. Lui, H. Y. Tam and M. S. Demokan, "All-Optical Bit-Error Monitoring System Using Cascaded Inverted Wavelength Converter and Optical NOR Gate," IEEE Photo. Technol. Lett., vol.15, pp. 593-595, 2003] [B. Nikarmi, M. R. Uddin and, Y. H. Won, "Realization of all-optical comparator using single mode Fabry Perot laser diodes," IEEE J. of Lightwave Technol., vol.29, pp. 3015-3021, 2011] [R. Hui, A. D. Ottavi, A. Mecozzi and P. Spano, "Injection locking in distributed feedback semiconductor lasers," IEEE J. of Quantum Electron., vol.27, pp. 1688-1695, 1991] [N. M. Hosiny, R. E. Agmy, M. M. El-Raheem and M. J. Adams, "Distributed feedback (DFB) laser under strong optical injection," Opt. Express, vol 283, pp. 579-582, 2010] [H. K. Tsang, L. Y. Chan, S. P. Yarn, and C. Shu, "Experimental characterization of dual-wavelength injection-locking of a Fabry-Perot laser diode," Optics Comm., vol.156, pp. 321-326, 1998] [G. R. Lin, Y. C. Chang, Y. H. Lin, and J. H. Chen, "All-Optical data format conversion in synchronously modulated single-mode Fabry Perot laser diode using external injection-locking induced non-linear threshold reduction effect," IEEE Photo. Technol. Lett., vol.17, pp. 1307-1309, 2005]

SUMMARY

The foregoing paragraphs have been provided by way of general introduction, and are not intended to limit the scope of the following claims. The described embodiments, together with further advantages, will be best understood by reference to the following detailed description taken in conjunction with the accompanying drawings.

According to one aspect of the disclosed subject matter, an optical logic device can include a distributed feedback laser configured to generate a first signal corresponding to distributed feedback laser output signal, the first signal being at a first wavelength, a bandpass filter having a center frequency corresponding to the first wavelength, and an optical circulator having a first port coupled to a logic device input signal, a second port coupled to the first signal, and a third port coupled to the bandpass filter, wherein when the logic device input signal has a power above a predetermined threshold and there is a wavelength difference between the first wavelength and an input wavelength of the logic device input signal, a suppression of the first signal occurs.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 6A displays a graphical view of an input signal temporal profile of the logic device input according to one or more aspects of the disclosed subject matter;

FIG. 6B displays a graphical view of an inverted signal of the input signal temporal profile according to one or more aspects of the disclosed subject matter;

FIG. 6C displays a graphical view of a rising edge of the inverted signal according to one or more aspects of the disclosed subject matter;

FIG. 6D displays a graphical view of a falling edge 615 of the inverted signal according to one or more aspects of the disclosed subject matter;

FIG. 8A depicts a graphical view of an input signal temporal profile of the NOT logic device according to one or more aspects of the disclosed subject matter;

FIG. 8B depicts a graphical view of an inverted signal of the input signal temporal profile according to one or more aspects of the disclosed subject matter;

FIG. 8C depicts a graphical view of a rising edge 810 of the inverted signal according to one or more aspects of the disclosed subject matter;

FIG. 8D depicts a graphical view of a falling edge of the inverted signal according to one or more aspects of the disclosed subject matter;

DETAILED DESCRIPTION

Figure 1:
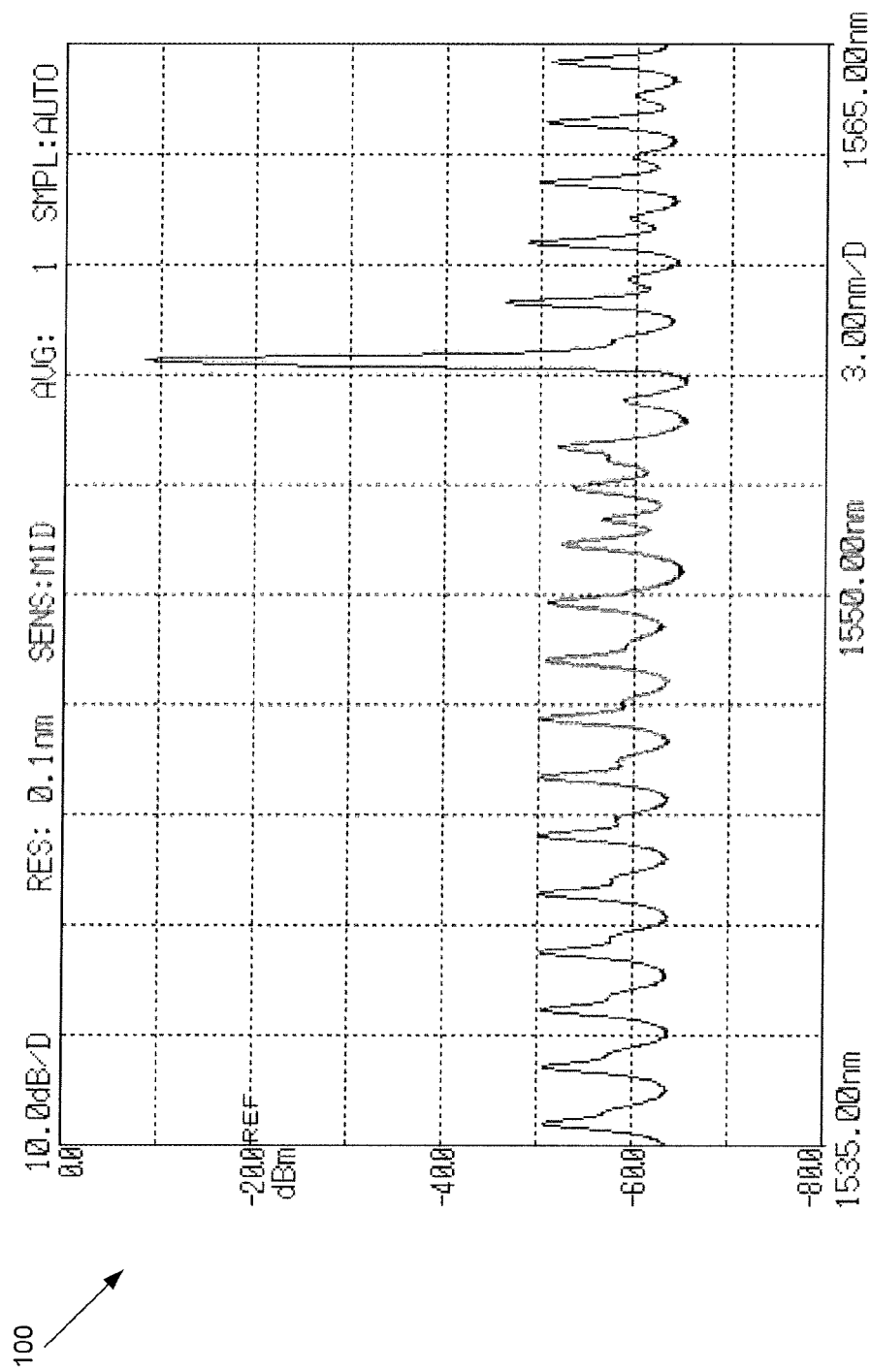
FIG. 1 depicts a graphical view of a spectrum of a free running distributed feedback (DFB) laser diode according to one or more aspects of the disclosed subject matter.

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, terms such as "first," "second," "third," etc., merely identify one of a number of portions, components, points of reference, operations and/or functions as described herein, and likewise do not necessarily limit embodiments of the disclosed subject matter to any particular configuration or orientation.

Referring now to the drawings, wherein like reference numerals designate identical or corresponding parts throughout the several views.

FIG. 1 depicts a graphical view of a spectrum 100 of a free running distributed feedback (DFB) laser diode, such as a DFB laser diode from WRI Wuhan Corp, for example. A DFB laser is a type of laser diode where the active region of the device is periodically structured as a diffraction grating. The structure of the diffraction grating can provide a one-dimensional interference grating which can provide optical feedback for the laser. The free running DFB laser diode spectrum 100 operating at I=1.85 $I_{th}$ can show a dominant longitudinal mode. In one aspect, as shown in FIG. 1, the dominant longitudinal mode can be at 1556.2 nanometers and the side modes have a side mode suppression ratio of 40 dBm. The 1556.2 nanometer wavelength can be based on the lasing wavelength for the DFB laser diode at a predetermined operating current. The wavelength can be tuned by changing the operating current of the DFB laser diode.

Figure 2:
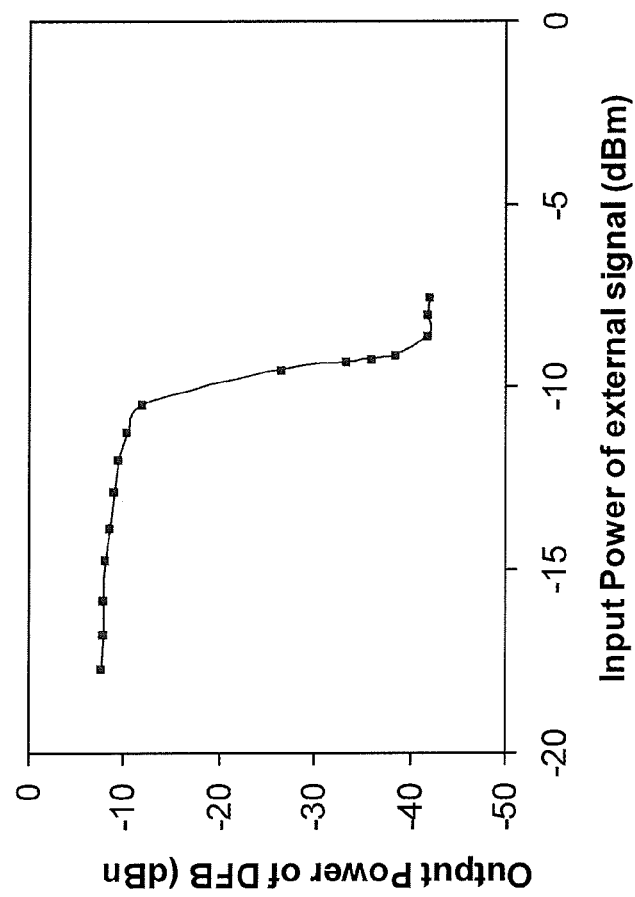
FIG. 2 depicts a graphical view of a pump/probe characterization of the DFB laser diode according to one or more aspects of the disclosed subject matter.

FIG. 2 depicts a graphical view of a pump/probe characterization 200 of the DFB laser diode. To initiate injection locking in a DFB laser diode (slave), an optical power of the pump (master) beam should be greater than a locking threshold of the DFB laser diode. The locking threshold is related to a wavelength detune between an injection beam (i.e., master) and a selected side mode of the DFB laser diode. Injection locking is a frequency effect that can occur when a first harmonic oscillator is disturbed by a second harmonic oscillator operating at a nearby frequency. In order to see a switching effect, the master (e.g., a C-band external cavity laser from Santec Corp) can be injected in one of the side modes of the DFB laser (e.g., at 1549.5 nm). As the pump power input is increased, a peak power of the probe (i.e., DFB laser diode) can begin to decrease, thereby showing the switching effect used to realize all-optical logic gates using injection locking in DFB laser diodes. The injected light competes with the spontaneous emission of the laser for amplification. When the injected light is strong enough it is amplified. At the same time, the injected light saturates the gain of the other modes and extinguishes all the other free-running modes. In FIG. 2, the exemplary pump/probe characterization 200, the pump power increased from −10 to −8 dBm, the output peak power of the probe signal decreased from −12 dBm to around −42 dBm showing a switching of 40 dB.

Figure 3:
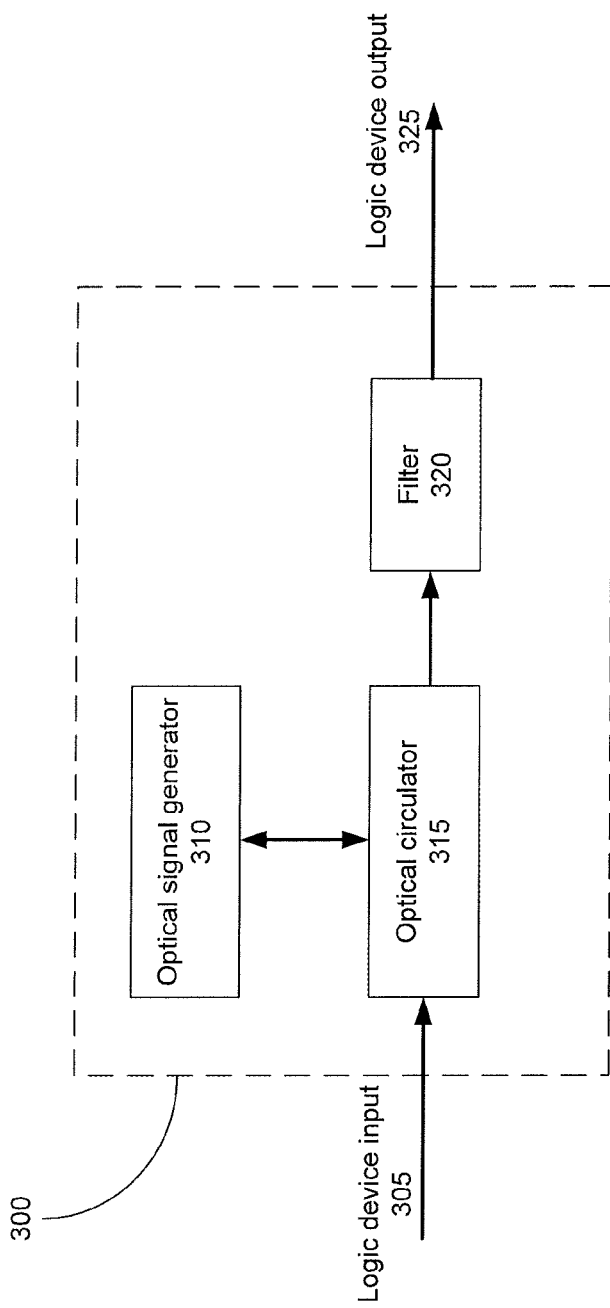
FIG. 3 depicts a block diagram of an optical logic device according to one or more aspects of the disclosed subject matter.

FIG. 3 depicts a block diagram of an optical logic device 300 according to one or more embodiments of the disclosed subject matter. The optical logic device 300 can include an optical signal generator 310 (e.g., a distributed feedback laser diode), an optical circulator 315, and a filter 320, which enables the optical logic device 300 to represent NOT logic. Additionally, the optical logic device 300 depicts a logic device input 305 (e.g., an optical signal) entering a first port of the optical circulator 315 and a logic device output 325 exiting the filter 320.

The optical circulator 315 can be a fiber-optic component that can be used to separate optical signals traveling in different directions. The optical circulator 315 may include at least one of a polarizing beam splitter cube, a birefringent block, a Faraday rotator, and a phase plate.

The output of the optical signal generator 310 can also enter the optical circulator 315 via a second port. In one aspect, the optical signal generator 310 may be a DFB laser diode operating at a current above a threshold current, the threshold current corresponding to the current being within the injection locking range as described in FIG. 7. In one example, the DFB laser diode may be operating at 1.85 $I_{th}$ and have a dominant longitudinal mode at a first wavelength. When the logic device input 305 has a power above a predetermined threshold and there is a wavelength difference between the first wavelength corresponding to the dominant longitudinal mode of the DFB laser diode and the logic device input 305, a suppression of the signal corresponding to the DFB occurs. The suppression ratio can be 40 dBm as described in FIG. 1.

The filter 320 is tuned at the first wavelength. For example, when the DFB laser diode (i.e., optical signal generator 310) is outputting a signal at the first wavelength, the filter 320 is tuned to the first wavelength that corresponds to the dominant longitudinal mode as would be understood by one of ordinary skill in the art.

The optical circulator 315 can be a passive, non-reciprocal three-port device in which a signal entering any port is transmitted to the next port in rotation, the ports being a point where an external waveguide, for example, connects to the optical circulator 315. The output of the optical circulator 315 feeds into the filter 320. Thus, the logic device input signal 305 is fed to the optical signal generator 310 via the optical circulator 315. The optical circulator 315 can ensure that the input 305 is injected into the optical signal generator 310 and further ensure that both the input 305 and the optical signal generator 310 are available at the output of the optical circulator 315. The filter 320 can filter frequencies within a predetermined range and attenuate frequencies not within the predetermined frequency range. The logic device output 325 signal exits the filter 320 as a signal being inverted relative to the logic device input 305.

The optical logic device 300 can be used to demonstrate a NOT logic device 400 and a NOR logic device 1200 as further described herein.

The logic device input signal 305 has a wavelength within the injection locking bandwidth of the longitudinal mode of the DFB laser diode (i.e., optical signal generator 310). The injection locking bandwidth of the DFB laser is a function of at least the coupling constant of the grating of the DFB laser diode, the length of the DFB laser, the injected power, and the DFB laser power as would be understood by one of ordinary skill in the art.

The input signal 305 can exit the optical circulator 315 and pass through the filter 320 as logic device output 325. In one aspect, the logic device output 325 is the inverted version (i.e., NOT operation) of the logic input device 305, thereby demonstrating a NOT operation. This logic gate can be a core logic unit to implement various all-optical systems for optical signal processing.

Figure 4:
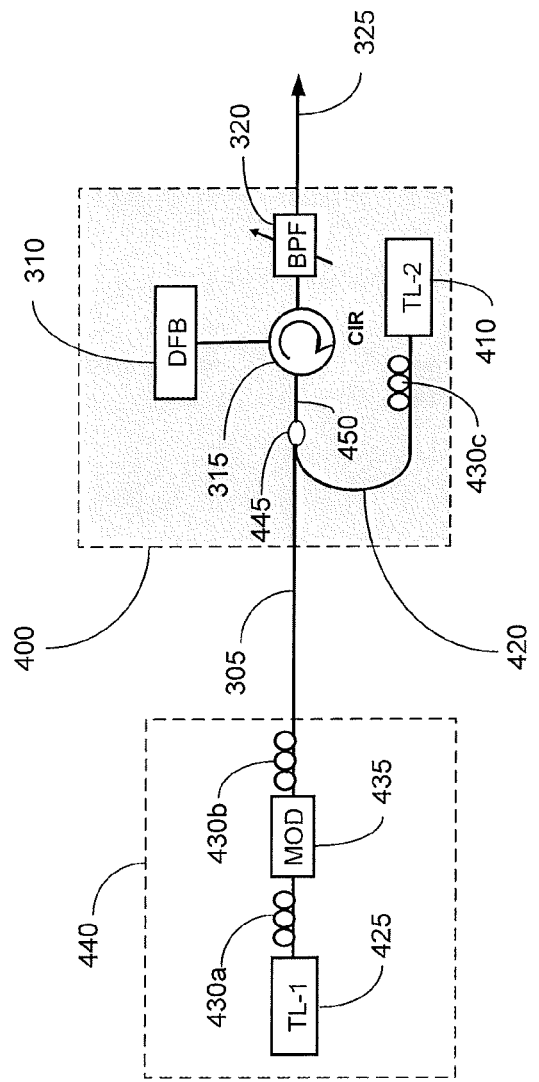
FIG. 4 depicts a block diagram of a NOT logic device including a stabilizer signal according to one or more aspects of the disclosed subject matter.

FIG. 4 depicts a block diagram of a NOT logic device 400 including a stabilizer signal 420 according to one or more embodiments of the disclosed subject matter. The stabilizer signal 420 can have a wavelength of 1546.7 nm, for example. The stabilizer wavelength can be within the injection locking range of the DFB laser diode gain spectrum. Therefore, the stabilizer signal can be injected in any of the side modes on either side of the resonant mode of the DFB laser diode. In one aspect, the logic device input 305 can be a signal generated via an input signal generator 440. The input signal generator 440 can include a first tunable laser 425, polarization controllers 430a and 430b, and a modulator 435. The signal (i.e., logic device input 305) generated from the first tunable laser 425 can pass by the polarization controller 430a, the modulator 435, and the polarization controller 430b prior to entering the optical circulator 315.

The polarization controllers 430a and 430b can adjust polarization of the signal corresponding to the logic device input 305 generated by the first tunable laser 425. In one example, the polarization controllers 430a and 430b may include three fiber coils in a sequence. The total retardation is proportional to the length of fiber and inversely proportional to its bending radius. The middle coil acts as a halfwaveplate and the outer ones as quarter waveplates. By adjusting the orientation of all three coils, the polarization of the signal may be transformed into the desired polarization state (e.g., polarization state of the signal from DFB laser) as would be understood by one of ordinary skill in the art.

The modulator 435 can vary one or more properties of a periodic wave form, such as the signal generated via the first tunable laser 425. In one example, the modulator 435 may be an electro-optic modulator. In the electro-optic modulator the electro-optic effect is used to modulate the signal based on a change in the refractive index. In one example, the modulator 435 may be a lithium Niobate intensity modulator.

The stabilizer signal 420 can be generated via a second tunable laser 410. The stabilizer signal 420 generated by the second tunable laser 410 can pass polarization controller 430c and interact with the logic device input 305 at coupler 445 to stabilize the logic device input 305 (generated via input signal generator 440) prior to the logic device input 305 entering the circulator 315. The coupler depicts a combination of two signals resulting in a combined signal 450 and can be any coupler as would be understood by one of ordinary skill in the art. The combination of the logic device input 305 and the stabilizer signal 420 can be a combined signal 450, the combined signal 450 being fed to the optical signal generator 310 via the optical circulator 315. The combined signal 450 can exit the circulator 315 and pass through the filter 320, which can be a bandpass filter, for example, before exiting the bandpass filter as logic device output 325 as an inverted signal relative to the logic device input 305 as a result of the NOT logic. In another aspect, the filter 320 can be a tunable bandpass filter.

Figure 5:
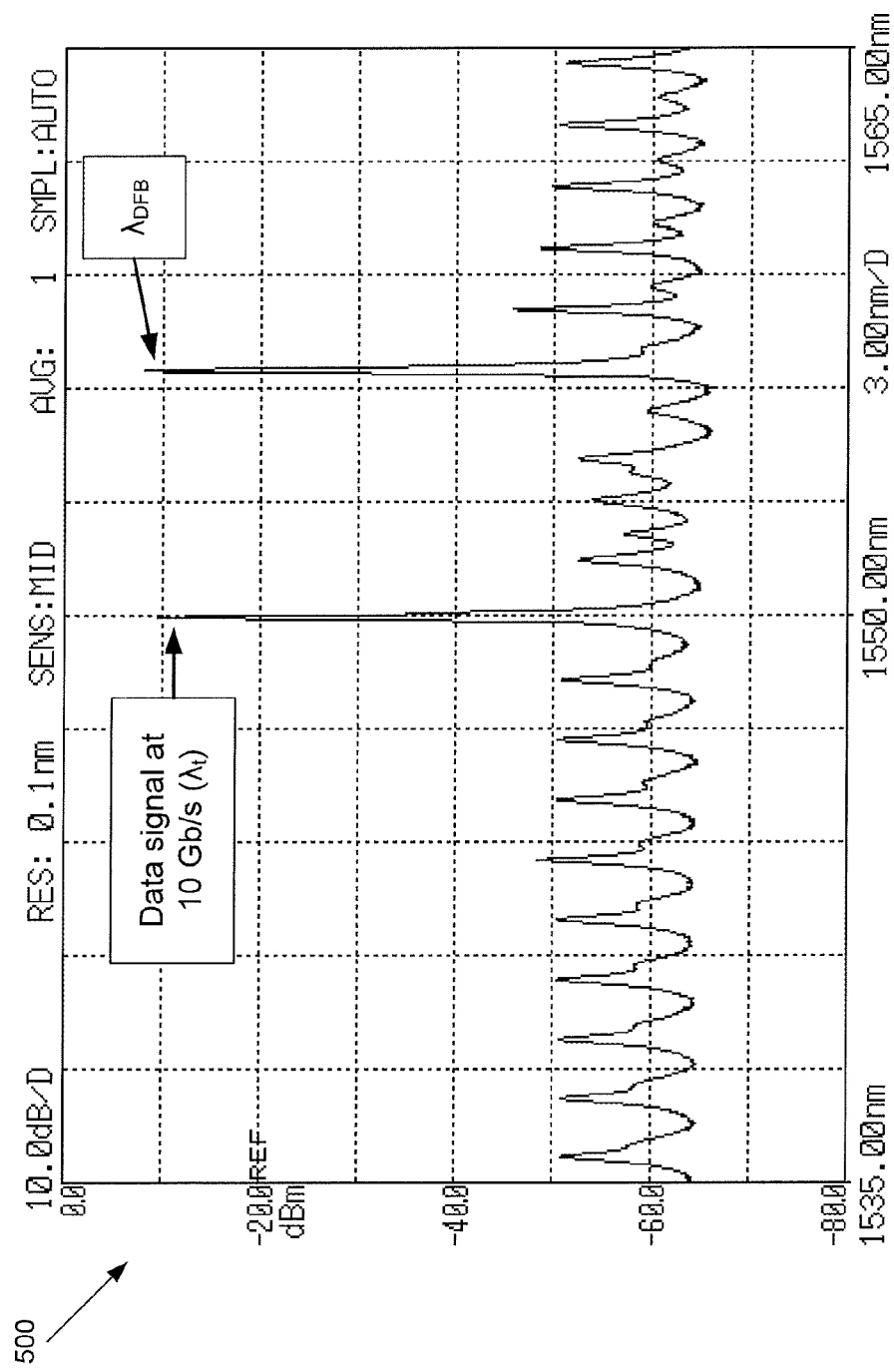
FIG. 5 depicts a graphical view of a NOT logic spectrum at the output of the circulator according to one or more aspects of the disclosed subject matter.

FIG. 5 depicts a graphical view of a NOT logic spectrum 500 at the output of the circulator 315. The spectrum can be shifted (e.g., red-shifted or blue-shifted) due to the injection locking. Therefore, the inverted data signal ($\lambda_{DFB}$) obtained in the output of the DFB laser can be completely inverted and then filtered via the bandpass filter (i.e., filter 320) with a specific bandwidth and tuned at $\lambda_{DFB}$.

FIG. 6A displays a graphical view of an input signal temporal profile 600 of the logic device input 305 as shown in FIG. 3.

FIG. 6B displays a graphical view of an inverted signal 605 of the input signal temporal profile 600.

FIG. 6C displays a graphical view of a rising edge 610 of the inverted signal 605. An interpretation of the rising edge 610 in the context of the optical logic device 300 is that the rising edge 610 is poor.

FIG. 6D displays a graphical view of a falling edge 615 of the inverted signal 605. An interpretation of the falling edge 615 in the context of the optical logic device 300 is that the falling edge 615 is poor.

Figure 7:
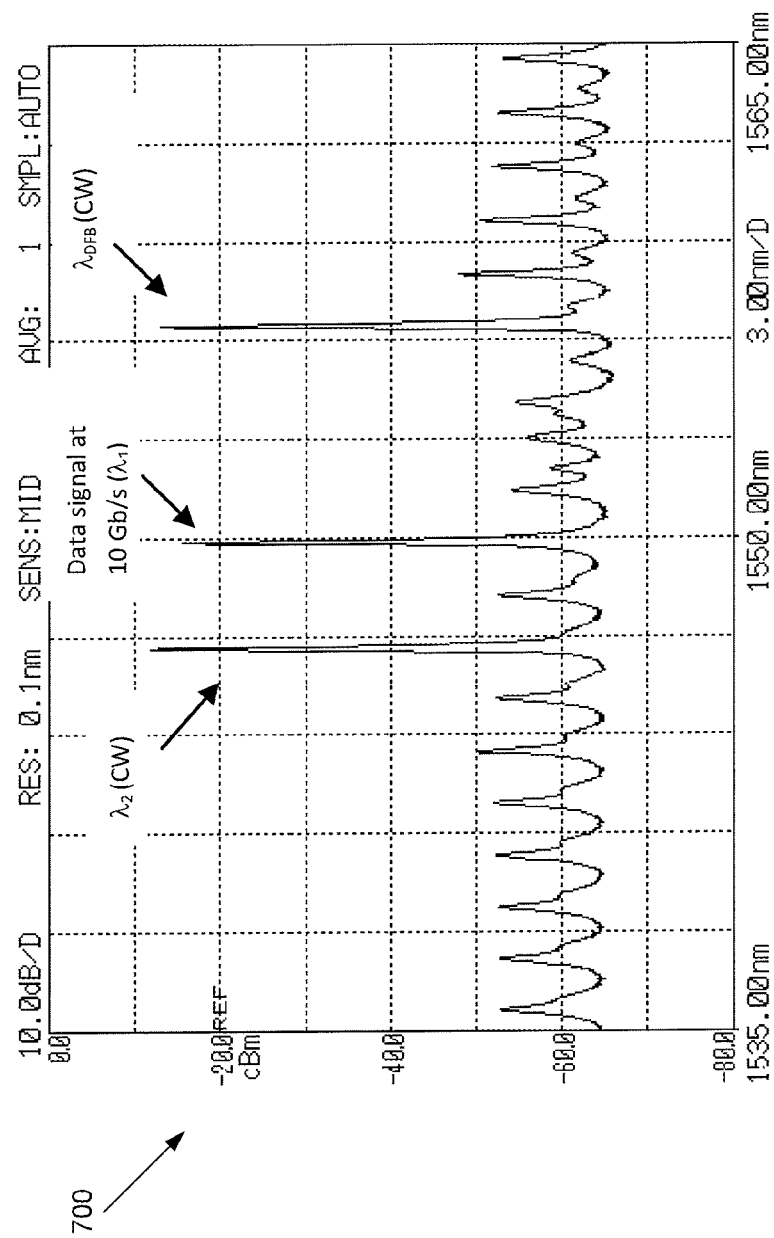
FIG. 7 depicts a graphical view of a stabilized spectrum according to one or more aspects of the disclosed subject matter.

FIG. 7 depicts a graphical view of a stabilized spectrum 700 such that the stabilized spectrum of the optical input signal includes inserting the stabilizer signal 410 into the DFB laser within the injection locking range of the respective mode of the DFB laser with a predetermined wavelength detune.

FIG. 8A depicts a graphical view of an input signal temporal profile 800 of the NOT logic device 400 including the stabilizer signal 410.

FIG. 8B depicts a graphical view of an inverted signal 805 of the input signal temporal profile 800.

FIG. 8C depicts a graphical view of a rising edge 810 of the inverted signal 805. An interpretation of the rising edge 810 in the context of the NOT logic device 400 is that the rising edge 810 is improved based on a narrowness of the rising edge 810.

FIG. 8D depicts a graphical view of a falling edge 815 of the inverted signal 805. An interpretation of the falling edge 815 in the context of the NOT logic device 400 is that the falling edge 810 is improved based on a narrowness of the falling edge 810.

Figure 9A:
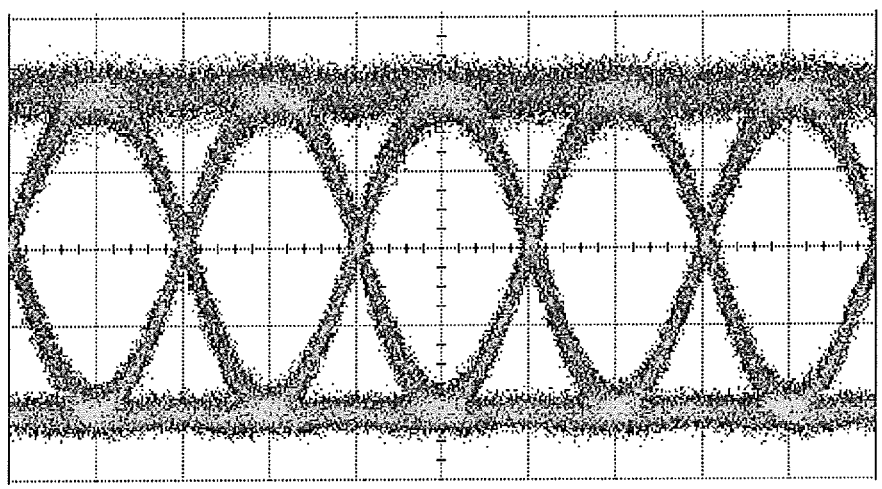
FIG. 9A depicts a graphical view of an input signal eye diagram of the optical signal corresponding to the logic device input according to one or more aspects of the disclosed subject matter.

FIG. 9A depicts a graphical view of an input signal eye diagram 900 of the optical signal corresponding to the logic device input 305.

Figure 9B:
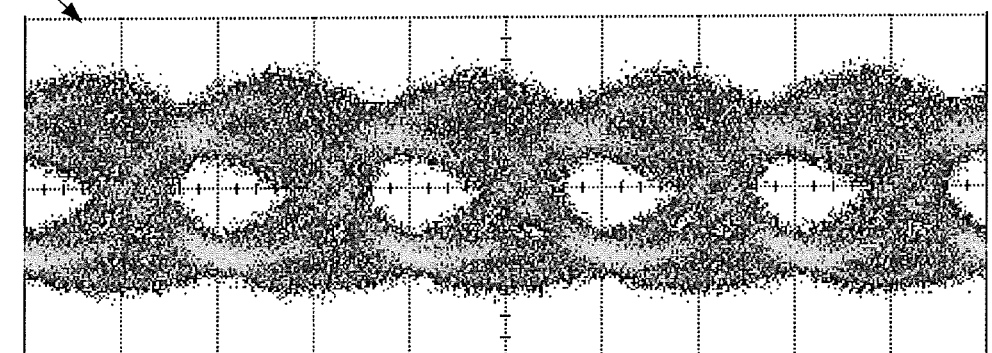
FIG. 9B depicts a graphical view of a $\lambda_{DFB}$ eye diagram according to one or more aspects of the disclosed subject matter.

FIG. 9B depicts a graphical view of a $\lambda_{DFB}$ eye diagram 805 corresponding to output obtained at the $\lambda_{DFB}$ wavelength.

Figure 9C:
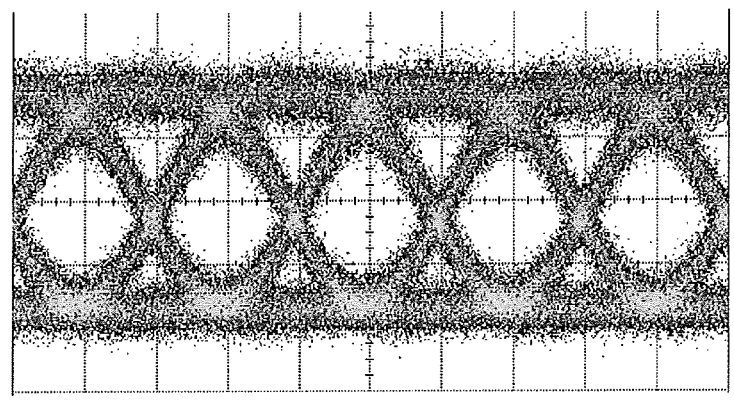
FIG. 9C depicts a graphical view of a stabilized eye diagram according to one or more aspects of the disclosed subject matter.

FIG. 9C depicts a graphical view of a stabilized eye diagram 810 corresponding to an input signal stabilized via stabilizer signal 410.

As shown in FIGS. 9A, 9B, and 9C, the best eye diagram performance was achieved when the output is filtered at the stabilizer signal wavelength.

Figure 10:
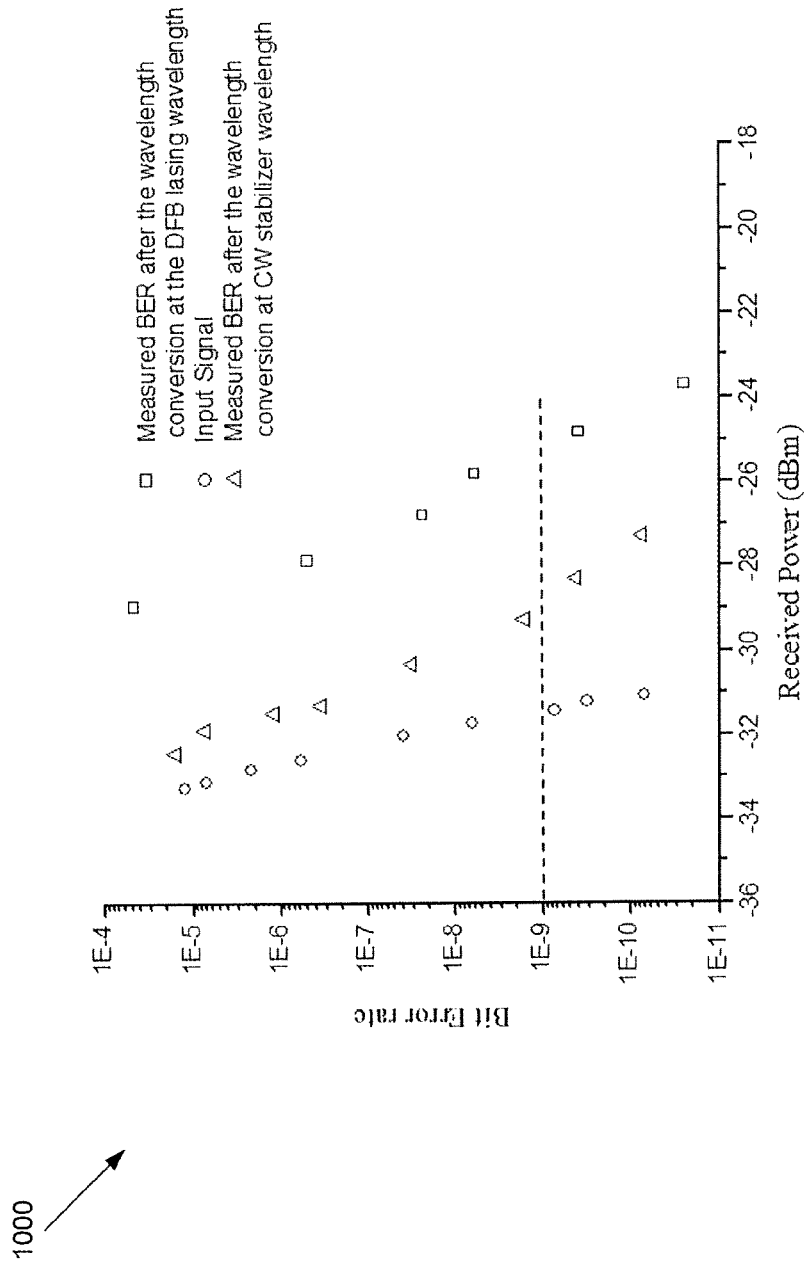
FIG. 10 displays a graphical view of bit error rate (BER) performance according to one or more aspects of the disclosed subject matter.

FIG. 10 displays a graphical view of bit error rate (BER) performance 1000 of the NOT logic. The BER performance is measured at a BER of $10^{-9}$.

Figure 11A:
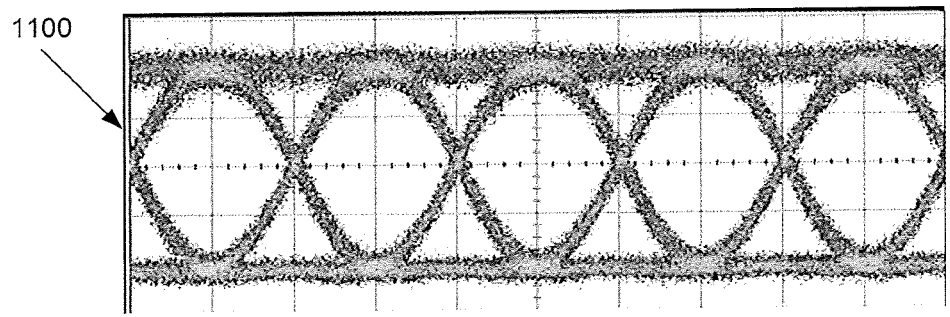
FIG. 11A depicts a graphical view of an input signal eye diagram according to one or more aspects of the disclosed subject matter.

FIG. 11A depicts a graphical view of an input signal eye diagram 1100.

Figure 11B:
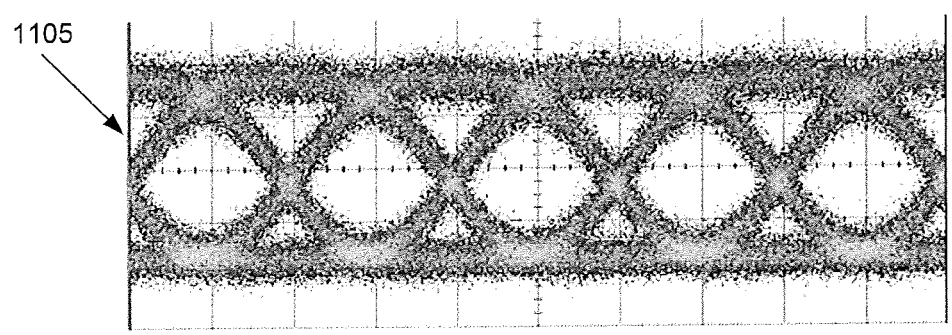
FIG. 11B depicts a graphical view of a NOT logic output eye diagram according to one or more aspects of the disclosed subject matter.

FIG. 11B depicts a graphical view of a NOT logic output eye diagram 1105.

In order to further evaluate the performance of the NOT logic a transmission experiment was performed over 25 km and 50 km single mode fiber (SMF-28) lengths respectively.

Figure 11C:
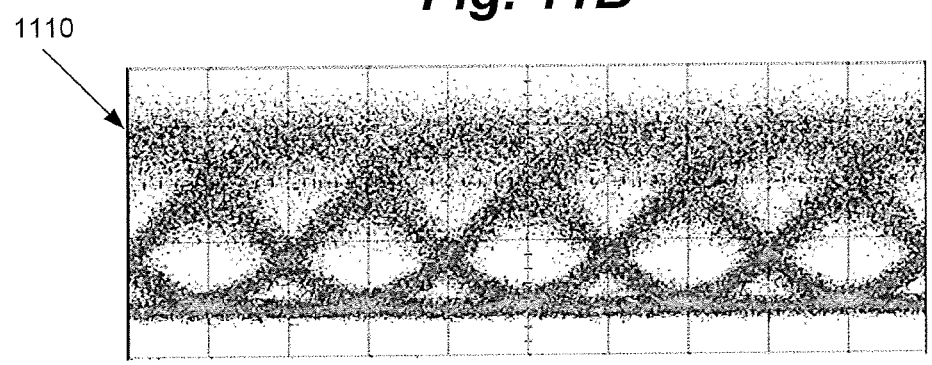
FIG. 11C depicts a graphical view of 25 kilometer eye diagram transmission 1110 according to one or more aspects of the disclosed subject matter.

FIG. 11C depicts a graphical view of 25 kilometer eye diagram transmission 1110.

Figure 11D:
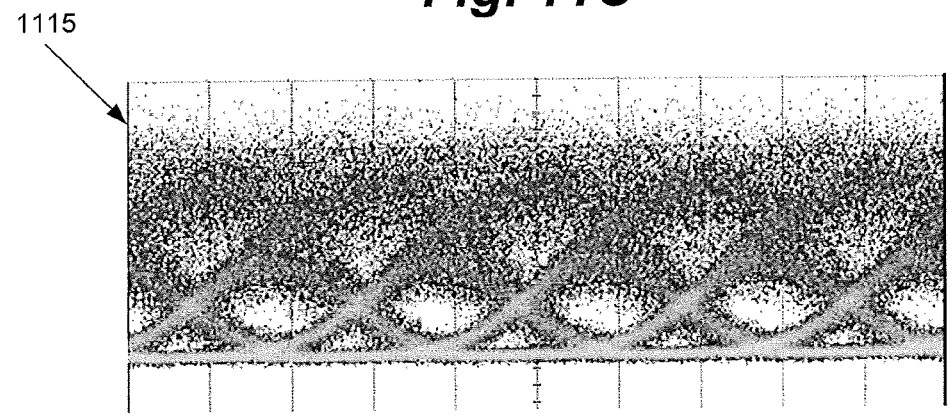
FIG. 11D depicts a graphical view of a 50 kilometer eye diagram transmission 1115 according to one or more aspects of the disclosed subject matter.

FIG. 11D depicts a graphical view of a 50 kilometer eye diagram transmission 1115.

The power penalty is only around 2 dB when the NOT logic is obtained at the stabilizer wavelength ($\lambda_2$). However, the power penalty degrades to 6.5 dB when output is obtained at wavelength ($\lambda_{DFB}$) in the absence of stabilizer beam at wavelength ($\lambda_2$). The eye closes and degrades only after the transmission of over 50 km and needs regeneration before further retransmission.

Figure 12:
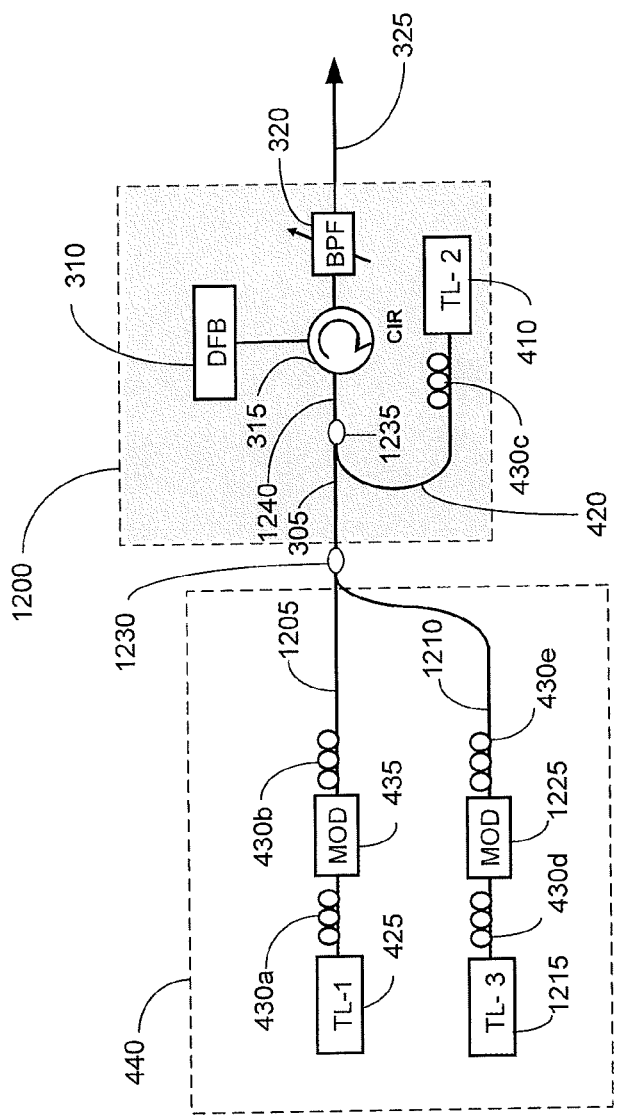
FIG. 12 depicts a block diagram of a NOR logic device according to one or more aspects of the disclosed subject matter.

FIG. 12 depicts a block diagram of a NOR logic device 1200 such that the logic device input 305, generated by the input signal generator 440, includes a first signal component 1205 and a second signal component 1210. The first signal component 1205 can be generated by the first tunable laser 425, have polarization adjusted by polarization controllers 430a and 430b, and interact with the modulator 435 as shown in FIG. 4. The second signal component 1210 can be generated by a wave generator (e.g., a third tunable laser 1215), the second signal component 1210 passing by a polarization controller 430d, a modulator 1225, and a polarization controller 430e prior to coupling with the first signal component 1205, the first signal component 1205 and the second signal component 1210 combining at a coupler 1230 to create the logic device input 305. The logic device input 305 can then combine with the stabilizer signal 420 (generated by another wave generator, such as the second tunable laser 410 polarized by polarization controller 430c) at coupler 1235. The combined signal 1240 can enter the circulator 315 through a first port while the output of the optical signal generator 310 can also enter the optical circulator 315 via a second port. The combined signal 1240 can then exit the circulator 315 and pass through the filter 320, which can be a bandpass filter, for example, before exiting the bandpass filter as logic device output 325 as an inverted signal relative to the logic device input 305 as a result of the NOR logic. The NOT logic implementation shown in FIG. 4 has a single input being injected into the DFB laser diode and the output is the inverted version (NOT logic) of the input. The NOR logic implementation shown in FIG. 12 has two inputs being injected into DFB laser diode and the output is NOR logic. The NOR gate can in some aspects be considered to be the universal logic gate because all other logic functions can be implemented using the NOR logic gate. The realization of future all-optical computers is dependent on the development of all types of digital logic functions.

Figure 13:
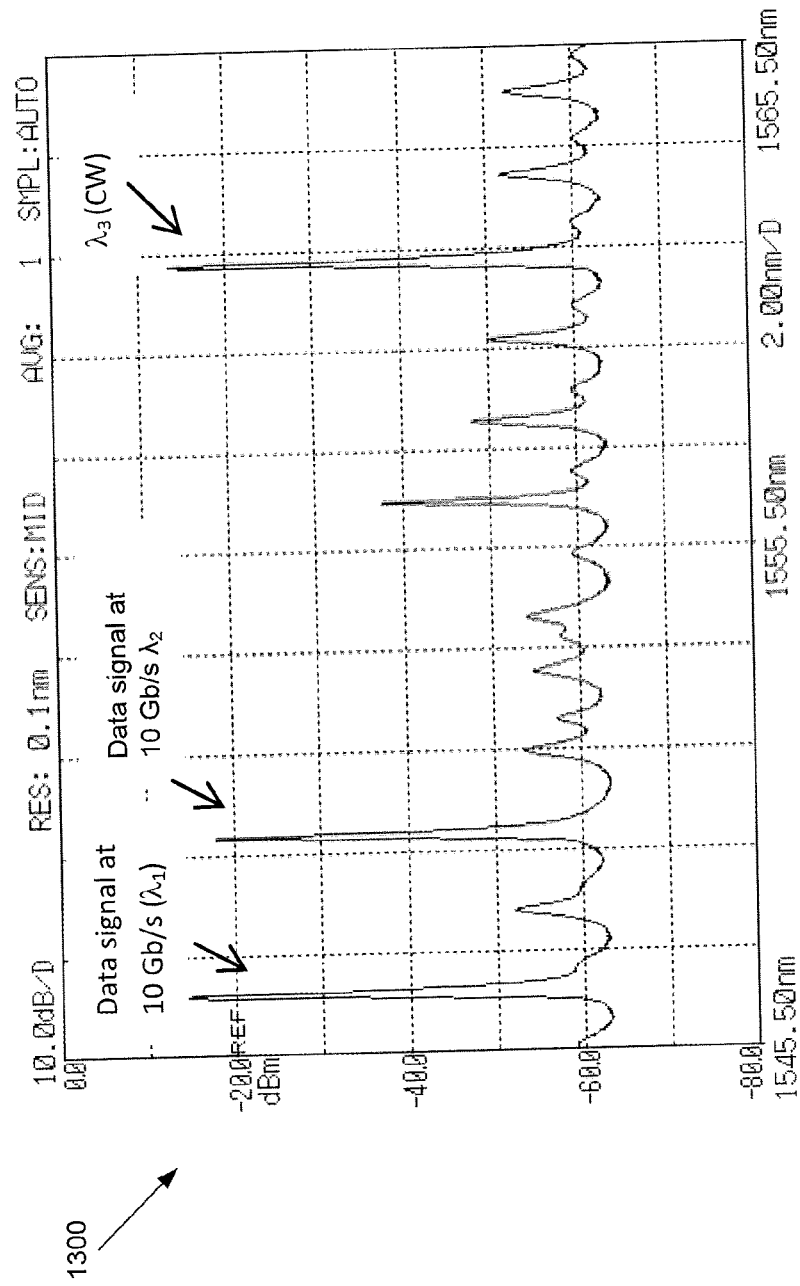
FIG. 13 depicts a graphical view of a NOR logic spectrum according to one or more aspects of the disclosed subject matter.

FIG. 13 depicts a graphical view of a NOR logic spectrum 1300 at the output of the optical circulator 315.

Figure 14A:
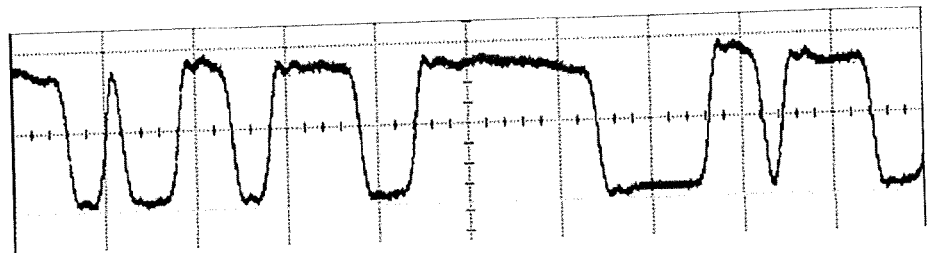
FIG. 14A depicts a graphical view of a first signal component temporal profile according to one or more aspects of the disclosed subject matter.

FIG. 14A depicts a graphical view of a first signal component temporal profile 1400 of the first signal component 1205 of the logic device input 305.

Figure 14B:
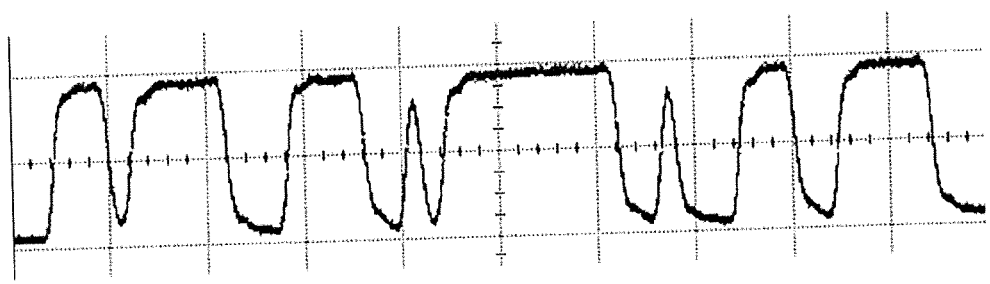
FIG. 14B depicts a graphical view of a second signal component temporal profile according to one or more aspects of the disclosed subject matter.

FIG. 14B depicts a graphical view of a second signal component temporal profile 1405 of the second signal component 1210 temporal profile 1405 of the logic device input 305. As discussed previously, the first signal component 1205 and the second signal component 1210 can combine to form the logic device input 305.

Figure 14C:
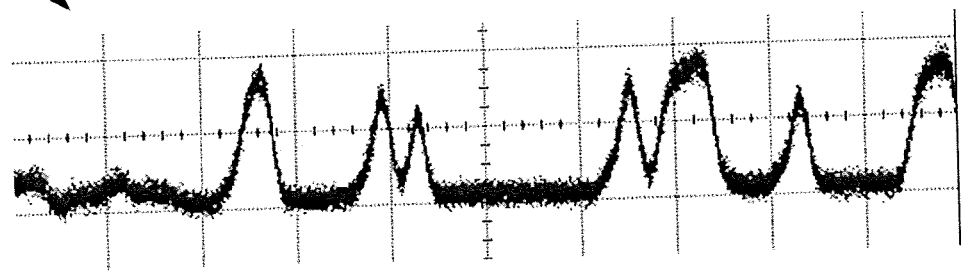
FIG. 14C depicts a graphical view of NOR logic output according to one or more aspects of the disclosed subject matter.

FIG. 14C depicts a graphical view of NOR logic output 1410.

Figure 15:
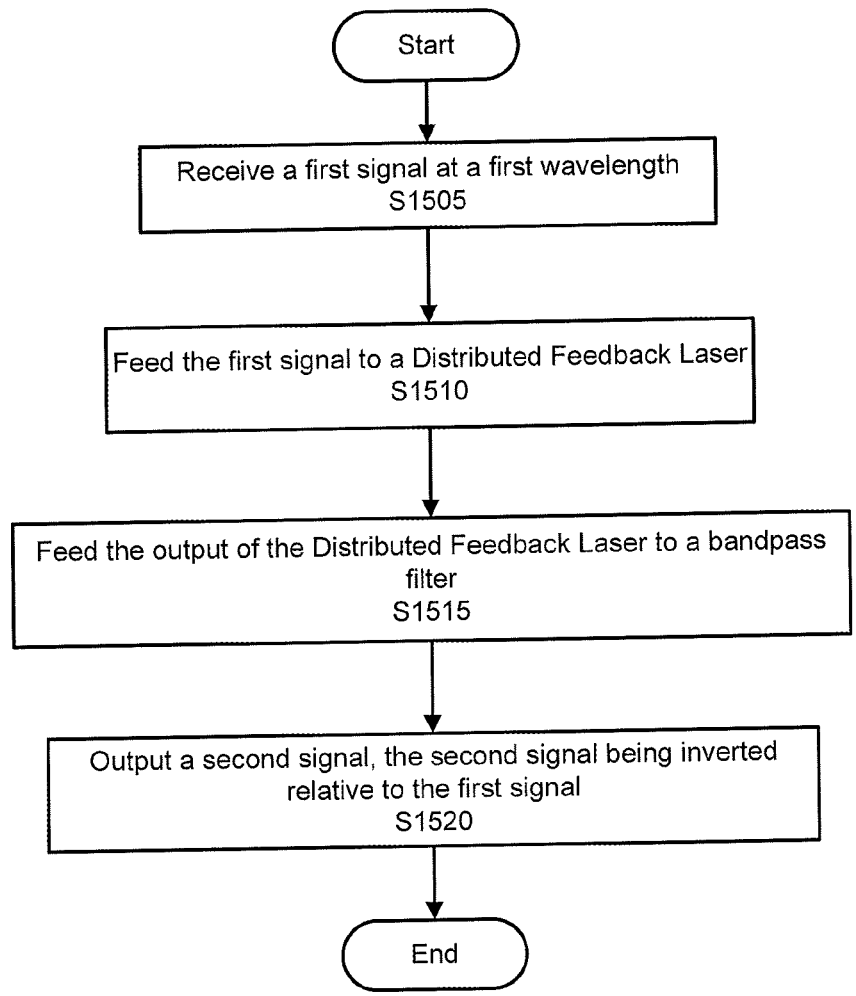
FIG. 15 is a flow chart of a method for inverting an input signal using an optical logic device according to one or more aspects of the disclosed subject matter.

FIG. 15 is a flow chart of a method for inverting an input signal using an optical logic device according to one or more aspects of the disclosed subject matter.

In S1505, an optical signal is modulated based on the input signal. The input signal represents the data signal to be inverted. The optical signal may be generated using a tunable laser at a wavelength within the injection locking range of the longitudinal mode of the optical signal generator 310.

In one example, the modulated signal may be coupled with a continuous wave signal (i.e., stabilizer signal 420)

generated by a continuous wave generator (e.g., the second tunable laser 410), the continuous wave signal having a second wavelength within the injection locking range of the longitudinal mode of the optical signal generator 310.

In S1510, the modulated signal is fed to the optical signal generator 310 (e.g., DFB laser diode) via an optical circulator (e.g., optical circulator 315).

In S1515, the output of the optical signal generator 310 is fed to the bandpass filter 320 via the optical circulator 315. The central frequency of the bandpass filter is tuned to match the wavelength of the longitudinal mode of the optical signal generator 310 in one example. In one example, the central frequency of the bandpass is tuned to match the wavelength of the stabilizer signal.

In S1520, a second signal (e.g., logic device output 325) is outputted from the output of the filter 320, the second signal being inverted relative to the first signal.

An advantage of the optical logic device 300 includes avoiding optical-electrical-optical conversions in high speed optical networks. The optical logic device 300 and various embodiments, such as NOT logic device 400 and NOR logic device 1200, provide the realization of all-optical computing, switching, multiplexing, label swapping, and the like.

The optical logic device 300 can be used to demonstrate NOT logic devices and NOR logic devices, such as NOT logic device 400 and NOR logic device 1200, respectively. The all-optical NOT and NOR logic can be used for adaptive data reshaping for optical communication and intelligent all-optical logic operation, such as in optical computing. The invertor is based on an injection locking technique in a DFB laser diode which is quite small in size when compared to fiber based inverters. For example, fiber based inverters can be very bulky, thereby needing long lengths of fiber to trigger nonlinearity.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The invention claimed is:

1. A signal wave generator apparatus with polarization control, comprising:
an input signal wave generator including
a first wave generator coupled to a first polarization controller and a first modulator configured to generate a first output, wherein the first modulator is configured to amplitude modulate the first output, and
a second wave generator coupled to a second polarization controller and a second modulator configured to generate a second output, wherein the second modulator is configured to amplitude modulate the second output,
wherein the input signal wave generator is configured to combine the first output and the second output at a first coupler generating a third output having a wavelength within an injection locking range of the first output, wherein the third output corresponds to the input signal generated by the input signal wave generator; and
a logic device configured to receive the input signal generated by the input signal wave generator, the logic device including
a laser configured to generate a fourth output at a first wavelength,
a third wave generator configured to generate a fifth output at a second wavelength, the second wavelength being identified based on an injection locking range of the first output, wherein the fifth output is coupled with the input signal at a second coupler and configured to stabilize the input signal,
a bandpass filter having a center frequency corresponding to the second wavelength, and
an optical circulator having a first port coupled to the input signal wave generator and the third wave generator, a second port coupled to the laser, and a third port coupled to the bandpass filter.

2. The apparatus of claim 1, wherein the fifth output performs adaptive data reshaping.

3. The apparatus of claim 1, wherein the bandpass filter is a tunable bandpass filter tuned at the first wavelength.

4. The apparatus of claim 1, wherein the injection locking is multi-wavelength injection locking.

5. The apparatus of claim 1,
wherein the bandpass filter outputs a sixth output, the sixth output being inverted relative to the input signal.

6. The apparatus of claim 1, wherein the first wavelength is 1556.2 nm and the second wavelength is 1546.7 nm.

7. The apparatus of claim 6, wherein the injection locking range is between 1549.8 nm and 1546.7 nm.

* * * * *